United States Patent [19]

Imfeld et al.

[11] Patent Number: 5,057,372
[45] Date of Patent: Oct. 15, 1991

[54] MULTILAYER FILM AND LAMINATE FOR USE IN PRODUCING PRINTED CIRCUIT BOARDS

[75] Inventors: Stephen M. Imfeld, Pataskala; Randall S. Shipley, Reynoldsburg, both of Ohio

[73] Assignee: The Dow Chemical Company, Midland, Mich.

[21] Appl. No.: 326,931

[22] Filed: Mar. 22, 1989

[51] Int. Cl.$^5$ .................... B32B 27/36; B32B 15/08
[52] U.S. Cl. .................... 428/412; 428/461; 428/476.9; 428/483; 428/516; 428/901
[58] Field of Search ............ 428/461, 458, 901, 411.1, 428/40, 476.9, 483, 516; 525/240, 191; 156/244.24, 150; 215/1 C

[56] References Cited

U.S. PATENT DOCUMENTS

| | | | |
|---|---|---|---|
| 3,544,662 | 12/1970 | Polestak et al. | 525/191 |
| 3,892,900 | 7/1975 | Shima et al. | 428/40 |
| 4,182,457 | 1/1980 | Yamada et al. | 215/1 C |
| 4,241,129 | 12/1980 | Marton et al. | 428/458 |
| 4,302,501 | 11/1981 | Nagashima | 428/901 X |
| 4,386,991 | 6/1983 | Shiomi et al. | 428/461 X |
| 4,410,388 | 10/1983 | Oizumi et al. | 428/901 X |
| 4,455,181 | 6/1984 | Lifshin et al. | 156/150 |
| 4,501,634 | 2/1985 | Yoshimura et al. | 156/244.24 |
| 4,546,150 | 10/1985 | Shigemoto | 525/240 |
| 4,604,324 | 8/1986 | Nahmias et al. | 428/349 |
| 4,617,207 | 10/1986 | Ueki et al. | 428/40 X |
| 4,690,845 | 9/1987 | Kloss, Jr. | 428/901 X |
| 4,753,847 | 6/1988 | Wilheim et al. | 428/411.1 |
| 4,857,400 | 8/1989 | Kloss, Jr. | 428/901 X |
| 4,861,648 | 8/1989 | Kleinschmidt et al. | 428/40 |
| 4,883,718 | 11/1989 | Ohta et al. | 428/458 |

FOREIGN PATENT DOCUMENTS

| | | |
|---|---|---|
| 56-111637 | 9/1981 | Japan . |
| 57-070653 | 5/1982 | Japan . |
| 57-070654 | 5/1982 | Japan . |
| 58-128846 | 8/1983 | Japan . |

*Primary Examiner*—Thomas J. Herbert, Jr.

[57] ABSTRACT

A multilayer film having as one surface layer thereof a support layer containing a thermoplastic resin able to withstand temperatures up to 200 degrees C. without softening and the other surface layer an adhesive layer containing a thermoplastic resin having a melting point ranging from about 100 to 200 degrees C. Optionally, a tie layer may be employed between the support layer and the adhesive layer. The multilayer film is useful as a protective carrier sheet for a cladding metal foil used in the production of printed circuit boards. The carrier sheet provides temporary, peelable surface protection for the cladding metal foil preventing contamination and physical damage to the foil both before and during printed circuit board formation. Adhesion of the carrier sheet to the cladding metal foil, measured using a 180 degree peel test is less than 0.4 pounds/in-width and greater than 0.005 pounds/in-width, and preferably less than 0.1 pounds/in-width and greater than 0.01 pounds/in-width.

20 Claims, 1 Drawing Sheet

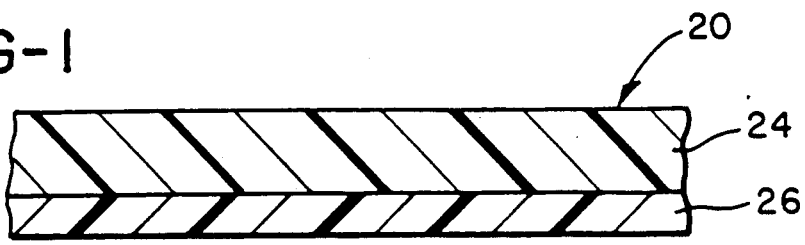
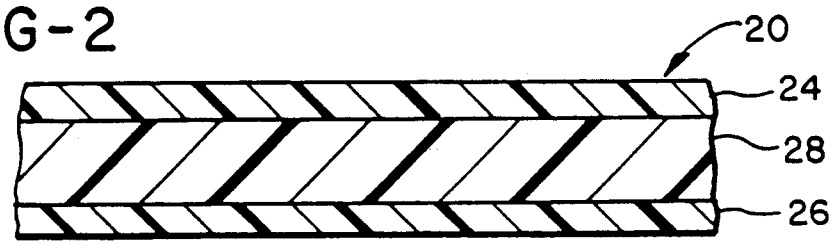
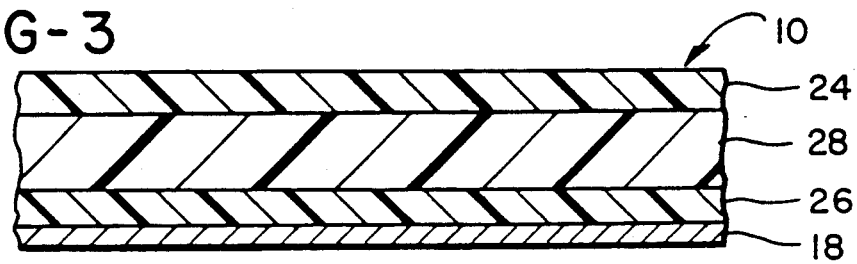
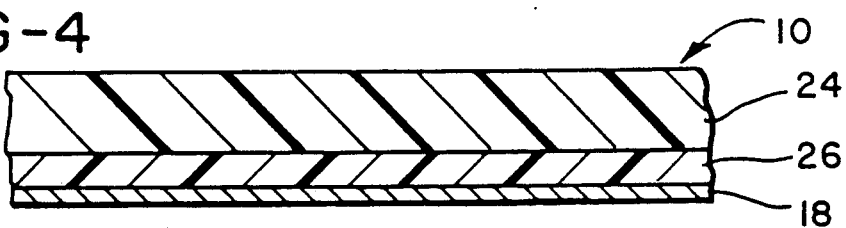
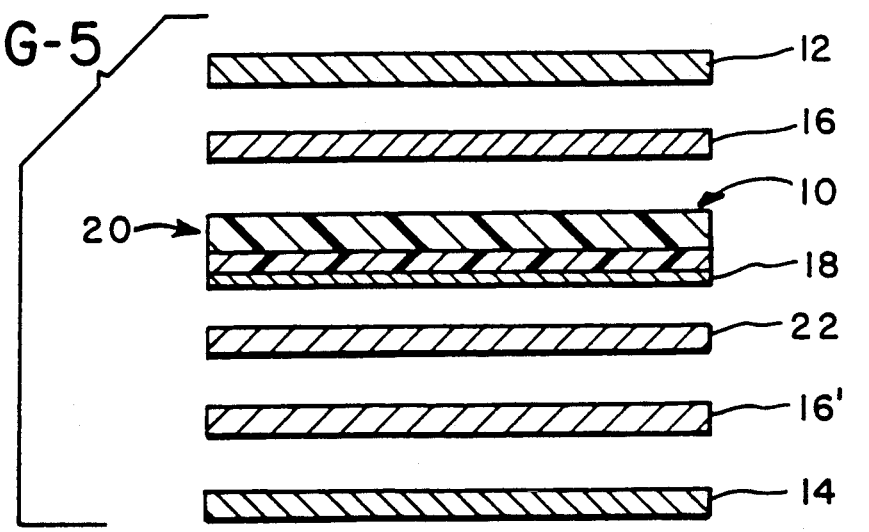

MULTILAYER FILM AND LAMINATE FOR USE IN PRODUCING PRINTED CIRCUIT BOARDS

BACKGROUND OF THE INVENTION

The present invention relates to a multilayer film which may serve as a protective carrier sheet for metal foil and a metal foil bearing laminate having special utility in the production of printed circuit boards. More particularly, it relates to a multilayer film which is useful as a temporary, peelable protective carrier sheet for a cladding metal foil used in the production of printed circuit boards.

Various methods are known for producing metal clad laminates useful in the production of printed circuit boards. In the typical process, metal clad laminates are produced by impregnating a fibrous substrate with a resin varnish, drying the substrate to prepare a prepreg, stacking one or more prepregs to a desired thickness, bonding a cladding metal foil on one or both sides of the prepreg stack with, optionally, an adhesive coating being applied on the surface of the metal foil, and finally curing the assemblage under heat and pressure in a molding press to laminate/mold it. Examples of patents which discuss various aspects of this conventional process include U.S. Pat. No. 4,302,501 directed to porous, heat resistant insulating substrates for use as prepregs in the production of printed circuit boards and U.S Pat. No. 4,410,388 directed to an aging process to avoid variations in performance of metal clad laminates in the production of printed circuit boards.

A recognized problem in the production of printed circuit boards is that the cladding metal foil may be subject to damage in the molding press. For that reason it has been suggested that a protective pad be used between the molding press and the metal foil layer. For example in U.S. Pat. No. 4,690,845 there is disclosed a "stratiform" sheet useful in a flat press method of laminating printed circuit boards. The stratiform sheet has a thermoplastic layer, a polymer release layer on one side, a polymeric stabilizing layer having a melting point higher than the laminating temperature peak, and a melting point higher than the peak. The stratiform sheet is said to be characterized by substantial freedom from creases, trapped gases, and contaminants. The stratiform sheet is utilized in the method of laminating printed circuits in a flat press by providing a work piece comprising one or more circuit assemblies in need of lamination, providing the stratiform sheets, and arranging each circuit assembly in a book with one of said stratiform sheets on each side of a circuit assembly with the release layers thereof facing the circuit assemblies in the press, then pressing the book for the press cycle time appropriate to the product and thickness of the book.

It is also known to use a poly-4-methylpentene-1 film as a releasable protective layer between a stainless steel press and a copper cladding metal foil in the manufacture of copper clad laminates. See Japanese patent document number 58/128,846 dated Aug. 1, 1983 in the name of Toshiba Chem. KK. See also Japanese patent documents number 57/070,654 and 57/070,653 dated May 1, 1982 in the name of Mitsubishi Gas Chem. Ind. (releasing film comprising 4-methylpentene-1 homopolymer, copolymer or a mixture with other resins used in laminating prepregs) and Japanese patent document number 56/111,637 dated Sept. 3, 1981 in the name of Hitachi Chemical KK (release film comprising 4-methylpentene-1homopolymer, and copolymers with polyethylene, polypropylene, vinyl acetate, etc. used in laminated sheet manufacture).

A somewhat similar system is shown in U.S. Pat. No. 4,753,847 where there is disclosed a mold release sheet which can be used in the production of printed circuit boards. The mold release sheet comprises a film of polyester, nylon or cellulose acetate treated for promoting resin adhesion and having a coating of a thin release layer of a cured release acrylated oligomer resin on at least one side of the film. In the molding operation, the mold release sheet may be selectively interleaved among the laminate-making layers and the press platens and caul plates.

The stratiform sheet/mold release sheet systems of the Japanese patent documents and U.S. Pat. Nos. 4,690,845 and 4,753,847 have a number of advantages. For example, at Col. 4, lines 45-60 of U.S. Pat. No. 4,753,847 the following advantages are listed:

The release sheet structure:
(i) does not stick to the clad, the prepreg sheet, the kraft sheet nor the laminate surfaces;
(ii) assists in preventing migration of flowable material from one laminate component to another;
(iii) does not shrink;
(iv) is resistant to embrittlement;
(v) has good tensile strength;
(vi) has sufficient rigidity to assist in handling;
(vii) does not emit excessive odors;
(viii) minimizes the static electric charges, thus easing removal from the mold; and
(ix) has good hole-forming characteristics whether drilled or punched.

Despite these advantages, a problem remains. While the stratiform sheet/mold release sheet protects the cladding metal foil during the molding process, the cladding metal foil may be subject to damage while handling before, during, or after the molding process. Typically, the cladding metal foil is a thin foil such as a copper foil which must be kept intact and free from surface contamination. It would, therefore, be desirable to protect/support the cladding metal foil particularly during handling before molding.

There is in the patent literature at least one reference to use of a transfer/support for a copper film to be used in producing printed circuit boards. Lifshin et al in U.S. Pat. No. 4,455,181 discloses vapor depositing a film of zinc on a copper film on a silica-coated aluminum carrier sheet, vapor depositing a silica film on the resulting zinc-copper foil, bonding the resulting body to a substrate (prepreg) and then stripping the silica-coated aluminum carrier sheet from the copper-clad laminate. At col. 1, lines 22-35, it is disclosed that rather than an aluminum carrier sheet, the carrier sheet may be a "sheet material of other metals as well as of plastics, such as DuPont commercial products known as MYLAR and KAPTON and other organic polymeric materials of similar flexibility which will withstand the processing temperatures involved in this invention and have the strength at the temperature of deposition of the copper film and the characteristics of inertness and bondability to release agent coatings necessary for coating adherence as copper-clad laminate products are stripped from the carrier sheets."

It would clearly be desirable to use an organic polymeric material as the carrier sheet in view of the lower cost, easier handling, more flexible nature of such materials. However, a number of difficulties are encountered in that regard. Foil contamination due to resin additives exuding to the foil surface must be controlled. Excessive adhesion also results in polymer contamination of the foil. Likewise, adhesion of the backside of a polymeric carrier to the molding press during molding is also a problem. The polymeric carrier sheet must provide sufficient support for the cladding metal foil so that the high temperatures and molding pressures do not damage it. Finally, the carrier sheet must be easily strippable from the cladding metal foil (i.e. it must have a peel value of less than about 0.4 lbs./inch-width). This is difficult to achieve with a polymer carrier because of polymer degradation during molding (which has been found to be increased due to the catalytic effect of the copper foil) and migration during molding of any adhesives used in conjunction with the polymeric carrier.

Accordingly, the need exists for an improved polymeric protective carrier sheet for cladding metal foil and for a cladding metal foil having a carrier sheet releasably laminated thereto which has special utility in the production of printed circuit boards.

SUMMARY OF THE INVENTION

That need is met by the present invention which provides a multilayer thermoplastic film adapted for use as a temporary, peelable protective carrier sheet for cladding metal foil and a laminate of the carrier sheet and cladding metal foil which may be used in the production of printed circuit boards.

The multilayer film may be a coextruded or laminated film having as one surface layer thereof a support layer containing an extrudable thermoplastic resin able to withstand temperatures up to 200 degrees C. without softening such as polymethylpentene (PMP), polyester (PBT or PET), polyamide, polycarbonate or copolymers of the foregoing materials. Preferably the support layer contains 80–100% polymethylpentene or polymethylpentene copolymer having a melting point of about 220–240 degrees C.

The other surface layer of the multilayer film is an adhesive layer containing at least one extrudable thermoplastic resin having a melting point ranging from about 100 to 200 degrees C. The term adhesive in this context depicts a layer which is capable of releasably bonding to a cladding metal foil. Thus the thermoplastic resin may be a polyolefin resin such as polyethylene, polypropylene, copolymers of propylene/ethylene, copolymers of ethylene with alpha olefins, or copolymers of propylene/ethylene. This layer may also contain up to 70% of a higher melting thermoplastic such as polymethylpentene or copolymers of polymethylpentene.

Optionally, a tie layer may be employed between the support layer and the adhesive layer. The tie layer may contain any polymeric material which improves the interply adhesion of the multilayer film yet does not interfere with the bond between the film's adhesive layer and the cladding metal foil. The tie layer may be composed of either a thermosetting laminating adhesive polymer such as polyethylene terephthalate (PET) with a toluene diisocyanate (TDI) catalyst or any of the thermoplastic resins utilized in either surface layer or blends thereof. In a preferred example, the tie layer contains a blend of the support layer and adhesive layer resins.

With a two-layer coextruded film, i.e. support layer and adhesive layer, the support layer comprises 5–95%, and preferably 75–85%, by weight of the multilayer film and the adhesive layer comprises 5–95%, and preferably 15–25%, by weight of the multilayer film. With a three-layer coextruded film, i.e. support layer, thermoplastic tie layer, and adhesive layer, the support layer comprises 5–90%, and preferably 10–20%, by weight of the multilayer film, the tie layer comprises 5–90%, and preferably 60–80%, by weight of the multilayer film, and the adhesive layer comprises 5–90%, and preferably 10–20%, by weight of the multilayer film.

With a three-layer laminated film, i.e. support layer, thermosetting resin tie layer, and adhesive layer, the support layer comprises 25–70%, and preferably 50–60%, by weight of the multilayer film, the tie layer may be 2–10%, and preferably 3–7%, by weight of the multilayer film, and the adhesive layer comprises 25–70%, and preferably 35–45%, by weight of the multilayer film.

The multilayer film, preferably, as mentioned, serves as a protective carrier sheet for a cladding metal foil such as copper foil. The carrier sheet may be applied to the cladding metal foil at any point following foil fabrication. By softening or melting the adhesive layer of the carrier sheet and then bringing it into contact with the metal foil, a controlled releasable bond can be formed. Adhesion of the carrier sheet to the cladding metal foil, measured using a 180 degree peel test is less than 0.4 pounds/in-width and greater than 0.005 pounds/in-width and preferably less than 0.1 pounds/in-width and greater than 0.01 pounds/in-width.

When the resulting film/foil laminate is placed in a heated platen press for lamination/molding to the prepreg in forming a printed circuit board, the heat resistant support layer of the carrier sheet supports the sheet and provides release from either the press plates or additional printed circuit board laminates present. Prior to printing the electrical circuit on the resulting printed circuit board, the carrier sheet can be easily removed, leaving a clean foil surface to be printed.

Accordingly, it is an object of the present invention to provide an improved temporary, peelable protective carrier sheet for a cladding metal foil and a resulting film/foil laminate which can be used in the production of printed circuit boards. These and other objects and advantages of the invention will become apparent from the following detailed description, the accompanying drawings and the appended claims.

BRIEF DESCRIPTION OF THE DRAWINGS

FIG. 1 is an enlarged cross-sectional view through one embodiment of the multilayer film making up the carrier sheet of the present invention.

FIG. 2 is an enlarged cross-sectional view through another embodiment of the multilayer film making up the carrier sheet of the present invention.

FIG. 3 is an enlarged cross-sectional view of the one embodiment of the laminate of the present invention, namely the carrier sheet of FIG. 2 having a cladding metal foil laminated thereto.

FIG. 4 is an enlarged cross-sectional view of another embodiment of the laminate of the present invention, namely the carrier sheet of FIG. 1 having a cladding metal foil laminated thereto.

FIG. 5 is a schematic view of the laminating/molding operation for producing printed circuit boards using the laminate of the present invention.

DETAILED DESCRIPTION OF THE PREFERRED EMBODIMENTS

Referring first to FIG. 5, there is schematically shown a molding assembly for producing printed circuit boards using film/foil laminate 10 of the present invention. Thus, a cladding metal foil layer 18 (in this case copper foil), supported by the protective carrier sheet 20, is laminated/molded to prepreg 22 which may be a reinforced epoxy resin. This molding process occurs between release layers 16 and 16' which may be composed of either rigid metal plates or plastic films which can withstand temperatures up to 200 degrees C. without softening. Multiples of this assembly may be placed between upper platen 12 and lower platen 14 such that several metal foil layers 18 are laminated/molded to several prepregs 22 in one process step.

Typically the lamination/molding cycle for producing the printed circuit board involves the following steps:
1) load press cold (ambient);
2) increase pressure to 300 psi; temperature set to 360 degrees F.;
3) hold for 20 minutes;
4) increase pressure to 600 psi;
5) hold for 90 minutes;
6) decrease temperature set point to ambient;
7) hold for 50 minutes;
8) decrease pressure; and
9) unlead press.

Following this process, carrier sheet 20 can be easily removed from cladding metal foil 18 and the circuit board subjected to further processing. Using a 180 degree peel test, adhesion between carrier sheet 20 of the present invention and cladding metal foil layer 18 is less than 0.4 pounds/in-width and greater than 0.005 pounds/in-width, and preferably less than 0.1 pounds/in-width and greater than 0.01 pounds/in-width. This is because of the unique multilayer film comprising the carrier sheet of the present invention.

In one embodiment carrier sheet 20 consists of a multilayer film of two extruded layers as shown in FIG. 1. As shown there, support layer 24 comprises 5–95%, and preferably 75–85%, by weight of the multilayer film. Support layer 24 contains an extrudable thermoplastic resin able to withstand temperatures up to 200 degrees C. without softening such as polymethylpentene (PMP), polyester (PBT or PET), polyamide, polycarbonate or copolymers of the foregoing materials. Preferably the support layer contains 80–100% polymethylpentene or polymethylpentene copolymer having a melting point of out 200–240 degrees C. The remaining components of support layer 24, if any, may be recycle materials and compatibilizers such as polyethylene, polypropylene, or copolymers or Adjoining support layer 24 is adhesive layer 26 which comprises about 5–95%, and preferably 15–25%, by weight of the multilayer film. The term adhesive in this context depicts a layer which is capable of releasably bonding to a cladding metal foil. Adhesive layer 26 contains at least one extrudable thermoplastic resin having a melting point ranging from about 100 to 200 degrees C. Thus, the thermoplastic resin may be a polyolefin resin such as polyethylene, polypropylene, copolymers of propylene/ethylene, copolymers of ethylene with alpha olefins, or copolymers of ethylene or propylene with a polar comonomer. Preferably the adhesive layer contains 30–100% polyethylene, polypropylene, or copolymers of propylene/ethylene. This layer may also contain up to 70% of a higher melting thermoplastic such as polymethylpentene or copolymers of polymethylpentene.

Another embodiment of carrier sheet 20 consists of three coextruded layers as shown in FIG. 2 where like numerals have been used. As in the first embodiment, there is a support layer 24 and an adhesive layer 26, but in this embodiment, those layers comprise 5–90%, and preferably about 10–20%, by weight of the multilayer film. Tie layer 28 makes up the rest, broadly in the range of about 5–90%, but preferably 60–80%, by weight of the multilayer film making up carrier sheet 20.

Tie layer 28 is employed to improve the interply adhesion between support layer 24 and adhesive layer 26. Tie layer 28 in this example may contain any extrudable thermoplastic resin which performs this function yet does not interfere with the bond between the film's adhesive layer 26 and cladding metal foil. The tie layer may be composed of any of the thermoplastic resins utilized in either support layer 24, adhesive layer 26, or blends thereof. Preferred in this embodiment, the tie layer contains a blend of polymethylpentene and the polyolefin resin employed in adhesive layer 26.

A third embodiment of carrier sheet 20 consists of three layers assembled using a lamination process. This multilayer film is also shown in FIG. 2 where like numerals have again been used. In this embodiment, support layer 24 comprises 25–70%, and preferably support layer 24 is a self supported film composed of polyethylene terephthalate (PET) resin.

Adhesive layer 26 comprises 25–70%, and preferably 35–45%, by weight of the multilayer film. Adhesive layer 26 is also a self supported film and is composed of the same polyolefin resins described in the first embodiment.

Tie layer 28 may be 2–10%, and preferably 3–7%, by weight of the multilayer film and is employed to improve the interply adhesion between support layer 24 and adhesive layer 26. Tie layer 28 in this example may contain any laminating adhesive which performs this function yet does not interfere with the bond between the film's adhesive layer 26 and cladding metal foil. Preferred in this embodiment, tie layer 28 is composed of a thermosetting laminating adhesive polymer such at PET with a toluene diisocyanate (TDI) catalyst.

EXAMPLE 1

The multilayer film illustrated in FIG. 1 and, subsequently, the laminate illustrated in FIG. 4 were prepared as follows:

Step A. A two-layer coextruded multilayer film was produced on both blown film and cast film pilot plant equipment. The following conditions were used to produce the blown film version:

| Multilayer Film Formulation - (Film Gauge - 2.0 mils) | | |
|---|---|---|
| Support Layer 24 (75%): | Polymethylpentene Copolymer | 100% |
| Adhesive Layer 26 (25%): | Polymethylpentene Copolymer | 60% |
| | Propylene/Ethylene Copolymer (20–25% ethylene) | 39.9% |
| | Phosphite Stabilizer | 0.05% |
| | Phenolic Stabilizer | 0.05% |
| | Layer | |

-continued

| Multilayer Film Formulation - (Film Gauge - 2.0 mils) | | |
|---|---|---|
| Extruder Conditions: | Support 24 | Adhesive 26 |
| Zone Temperature Range (F.) | 475–550 | 450–485 |
| Melt Temperature Range (F.) | 495–525 | 470–485 |
| Die Conditions: | | |
| Average Temperature (F.) - 490 | | |
| Die Gap (inches) - 0.040 | | |
| Draw Down Ratio - 12:1 | Die Diameter (inches) - 6 | |
| | Blow up Ratio - 1.7:1 | |

Step B. The two-layer multilayer film formed in Step A was used as a protective carrier sheet 20 for a cladding metal foil layer 18. A roll of 2.0-mil film was thermally laminated to a roll of 1.5-mil copper foil using a laminator having a heated metal bottom roll and a non-heated rubber top roll. The hot roll temperature was 455 degrees F. and nip pressure was 85 psi. Each web was preheated using 320 degrees F. preheat rolls. The result is a laminate 10 as shown in FIG. 4.

The laminate formed in Step B can then be applied to an epoxy dielectric material using a heated press process as illustrated by FIG. 5. Following this process, carrier sheet 20 can be easily removed from cladding metal foil layer 18 and the circuit board subjected to further processing. Using a 180 degree peel test, adhesion between carrier sheet 20 and cladding material foil 18 was found to be less than 0.1 pounds/in-width and greater than 0.01 pounds/in-width.

EXAMPLE II

The multilayer film illustrated in FIG. 2 and, subsequently, the laminate illustrated in FIG. 3 were prepared as follows:

Step A. A three-layer coextruded multilayer film was produced on both blown film and cast film pilot plant equipment. The following conditions were used to produce the blown film version:

| Multilayer Film Formulation - (Film Gauge - 2.0 mils) | | | |
|---|---|---|---|
| Support Layer 24 (15%): | Polymethylpentene Copolymer | 100% | |
| Tie Layer 28 (60%): | Polymethylpentene Copolymer | 60% | |
| | Propylene/Ethylene Copolymer (20–25% ethylene) | 39.9% | |
| | Phosphite Stabilizer | 0.05% | |
| | Phenolic Stabilizer | 0.05% | |
| Adhesive Layer 26 (25%): | Propylene/Ethylene Copolymer (20–25% ethylene) | 99.75% | |
| | Phospite Stabilizer | 0.125% | |
| | Phenolic Stabilizer Layer | 0.125% | |
| Extruder Conditions: | Support 24 | Tie Layer 28 | Adhesive 26 |
| Zone Temperature Range (F.) | 475–550 | 450–485 | 375–420 |
| Melt Temperature Range (F.) | 495–525 | 470–485 | 410–420 |
| Die Conditions: | | | |
| Average Temperature (F.) - 490 | | | |
| Die Gap (inches) - 0.040 | | | |
| Draw Down Ratio - 12:1 | Die Diameter (inches) - 6 | | |
| | Blow up Ratio - 1.7:1 | | |

Step B. The three layer multilayer film formed in Step A was used as a protective carrier sheet 20 for a cladding metal foil layer 18. A roll of 2.0-mil film was thermally laminated to a roll of 1.5-mil copper foil using a laminator having a heated metal bottom roll and a non-heated rubber top roll. The hot roll temperature was 420 degrees F. and nip pressure was 85 psi. The copper foil web was preheated using a 290 degrees F. preheat roll. The result is a laminate 10 as shown in FIG. 3.

The laminate formed in Step B can then be applied to an epoxy dielectric material using a heated press process as illustrated by FIG. 5. Following this process, carrier sheet 20 can be easily removed from cladding metal foil layer 18 and the circuit board subjected to further processing. Using a 180 degree peel test, adhesion between carrier sheet 20 and cladding metal foil 18 was found to be less than 0.1 pounds/in-width and greater than 0.01 pounds/in-width.

EXAMPLE III

The multilayer film illustrated in FIG. 2 and, subsequently, the laminate illustrated in FIG. 3 were prepared as follows:

Step A. Adhesive layer 26, formed as a monolayer film, was produced on blown film pilot plant equipment under the following conditions:

| Monolayer Film Formulation - (Film Gauge - 1.5 mils) | |
|---|---|
| Propylene/Ethylene Copolymer (20–25% ethylene) | 99.7% |
| Phosphite Stabilizer | 0.15% |
| Phenolic Stabilizer | 0.15% |
| Extruder Conditions: | |
| Zone Temperature Range (F.) | 375–415 |
| Melt Temperature (F.) | 405–415 |
| Die Conditions: | |
| Average Temperature (F.) - 400 | |
| Die Gap (inches) - 0.040 | Die Diameter (inches) - 8 |
| Draw Down Ratio - 13:1 | Blow up Ratio - 2:1 |
| Corona Treat Level (Dynes) - >40 | |

Step B. The corona treated film formed in Step A was adhesively laminated to a corona treated 1.0 mil polyester (PET) film support layer 24 using a tie layer 28 of a thermosetting polyethylene terephthalate (PET) adhesive containing a toluene diisocyanate (TDI) catalyst. The result was a multilayer film as shown in FIG. 2.

Step C. The multilayer film formed in Step B was used as a protective carrier sheet 20 for a cladding metal foil layer 18. A roll of 2.5-mil film was thermally laminated to a roll of 1.5-mil copper foil using a laminator having a heated metal bottom roll and a non-heated rubber top roll. The hot roll temperature was 420 degrees F. and nip pressure was 85 psi. The copper foil web was preheated using a 290 degrees F. preheat roll. The result is a laminate 10 as shown in FIG. 3.

The laminate formed in Step C can then be applied to an epoxy dielectric material using a heated press process as illustrated by FIG. 5. Following this process, carrier sheet 20 can be easily removed from cladding metal foil layer 18 and the circuit board subjected to further processing. Using a 180 degree peel test, adhesion between carrier sheet 20 and cladding metal foil 18 was found to be less than 0.1 pounds/in-width and greater than 0.01 pounds/in-width.

What is claimed is:

1. A laminate for use in production of printed circuit boards comprising:
   a layer of a cladding metal foil and
   a releasable protective carrier sheet for said metal foil comprising a multilayer film having as one surface thereof a support layer containing an extrudable thermoplastic resin able to withstand up to 200 degrees C. without softening and as the other surface thereof an adhesive layer containing at least one extrudable thermoplastic resin having a melting point range of from 100 to 200 degrees C., said adhesive layer releasably bonding said carrier sheet to said cladding metal foil layer.

2. The laminate of claim 1 wherein said cladding metal foil is copper foil.

3. The laminate of claim 2 wherein said adhesive layer contains a polyolefin resin.

4. The laminate of claim 3 wherein said support layer contains a resin selected from the group consisting of polymethylpentene, polyamide, polycarbonate resins, and copolymers and mixture thereof.

5. The laminate of claim 3 wherein said support layer contains 80–100% polymethylpentene homopolymer or copolymer.

6. The laminate of claim 5 wherein said multilayer film is coextruded and said support layer comprises about 75–85% by weight of said multilayer film and said adhesive layer comprises about 15–25% by weight of said multilayer film.

7. The laminate of claim 1 further including a tie layer between said support layer and said adhesive layer.

8. The laminate of claim 1 wherein said tie layer is a blend of the resin of said support layer and the resin of said adhesive layer.

9. A laminate for use in production of printed circuit boards comprising:

a layer of cladding metal foil, and a carrier sheet comprising a coextruded multilayer film having as one surface thereof a support layer comprising about 10–20% by weight of said multilayer film, said support layer containing an extrudable thermoplastic resin able to withstand up to 200° C. without softening; said multilayer film having as the other surface thereof an adhesive layer comprising about 10–20% by weight of said multilayer film, said adhesive layer containing at least one extrudable thermoplastic resin having a melting point range of from 100° to 200° C., and having a tie layer between said support layer and said adhesive layer, said tie layer being a blend of the resin of said support layer and the resin of said adhesive layer and comprising about 60–80% be weight of said multilayer film, said adhesive layer releasably bonding said carrier sheet to said cladding metal foil layer.

10. A laminate for use in production of printed circuit boards comprising:

a copper foil layer, and a releasable protective carrier sheet for said copper foil layer comprising a multilayer film having as one surface thereof a support layer containing polyester resin and as the other surface thereof an adhesive layer containing polyolefin resin, said adhesive layer releasably bonding said copper foil layer to said carrier sheet.

11. The laminate of claim 10 further including a tie layer between said support layer and said adhesive layer, said tie layer containing a thermosetting polyethylene terephthalate resin.

12. A laminate for use in production of printed circuit boards comprising:

a copper foil layer, and a carrier sheet comprising a laminated multilayer film having as one surface thereof a support layer comprising about 50–60% by weight of said multilayer film, said support layer containing polyester resin; said multilayer film having as the other surface thereof an adhesive layer comprising about 35–40% by weight of said multilayer film, said adhesive layer containing polyolefin resin, and having a tie layer between said support layer and said adhesive layer, said tie layer comprising about 3–7% by weight of said multilayer film and containing a thermosetting polyethylene terephthalate resin, said adhesive layer releasably bonding said copper foil layer to said carrier sheet.

13. A releasable protective multilayer film for use as a temporary, peelable protectable carrier sheet for cladding metal foil used in the production of printed circuit boards, comprising:

a support layer containing polymethylpentene resin, and an adhesive layer containing polyolefin resin adjoined to said polymethylpentene layer, said adhesive layer releasably bonding said support layer to the cladding metal foil.

14. The releasable protective multilayer film of claim 13 wherein said support layer contains 80–100% of a polymethylpentene or polymethylpentene copolymer having a melting point of about 220°–240° C.

15. The releasable multilayer film of claim 14 wherein said polyolefin resin is selected from the group consisting of polyethylene, polypropylene, copolymers of propylene/ethylene, copolymers of ethylene with alpha olefins, and copolymer of ethylene or propylene with a polar comonomer.

16. The releasable protective multilayer film of claim 15 wherein said support layer and said adhesive layer are coextruded.

17. The releasable protective multilayer film of claim 16 wherein said support layer comprises about 75–85% by weight of said multilayer film and said adhesive layer comprises about 15–25% by weight of said multilayer film.

18. The releasable protective film of claim 15 further including a tie layer between said support layer and said adhesive layer.

19. The releasable protective multilayer film of claim 18 wherein said tie layer is a blend of polymethylpentene resin and polyolefin resin.

20. A multilayer film adapted for use as a temporary, peelable protection carrier sheet for cladding metal foil used in the production of printed circuit boards, comprising:

a support layer comprising 10–20% by weight of said multilayer film, said support layer containing 80–100% of a polymethylpentene or polymethylpentene copolymer having a melting point of about 220°–240° C., an adhesive layer comprising 10–20% by weight of said multilayer film, said adhesive layer containing polyolefin resins selected from the group consisting of polyethylene, polypropylene, copolymers of propylene/ethylene, copolymers of ethylene with alpha olefins, and copolymers of ethylene or propylene with a polar comonomer, and a tie layer between said support layer and said adhesive layer, said tie layer comprising 60–80% by weight of said multilayer film and being a blend of polymethylpentene resin and polyolefin resin.

* * * * *